(12) United States Patent
Yu et al.

(10) Patent No.: US 9,165,875 B2
(45) Date of Patent: Oct. 20, 2015

(54) LOW PROFILE INTERPOSER WITH STUD STRUCTURE

(75) Inventors: Chen-Hua Yu, Hsin-Chu (TW);
Mirng-Ji Lii, Sinpu Township (TW);
Hao-Yi Tsai, Hsin-Chu (TW);
Kai-Chiang Wu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 239 days.

(21) Appl. No.: 13/456,038

(22) Filed: Apr. 25, 2012

(65) Prior Publication Data
US 2013/0285237 A1    Oct. 31, 2013

(51) Int. Cl.
| H01L 23/498 | (2006.01) |
| H01L 25/10 | (2006.01) |
| H01L 21/48 | (2006.01) |
| H01L 23/00 | (2006.01) |
| H01L 21/56 | (2006.01) |
| H01L 25/065 | (2006.01) |

(52) U.S. Cl.
CPC ...... H01L 23/49811 (2013.01); H01L 21/4853 (2013.01); H01L 23/49816 (2013.01); H01L 24/97 (2013.01); H01L 25/105 (2013.01); H01L 21/563 (2013.01); H01L 23/49827 (2013.01); H01L 23/49894 (2013.01); H01L 24/16 (2013.01); H01L 24/32 (2013.01); H01L 24/48 (2013.01); H01L 25/0657 (2013.01); H01L 2224/13017 (2013.01); H01L 2224/13078 (2013.01); H01L 2224/16225 (2013.01); H01L 2224/16227 (2013.01); H01L 2224/32145 (2013.01); H01L 2224/32225 (2013.01); H01L 2224/48091 (2013.01); H01L 2224/48227 (2013.01); H01L 2224/73204 (2013.01); H01L 2224/73215 (2013.01); H01L 2224/73265 (2013.01); H01L 2224/81193 (2013.01); H01L 2224/97 (2013.01); H01L 2225/0651 (2013.01); H01L 2225/06565 (2013.01); H01L 2225/1023 (2013.01); H01L 2225/1058 (2013.01); H01L 2924/15311 (2013.01); H01L 2924/15331 (2013.01)

(58) Field of Classification Search
None
See application file for complete search history.

(56) References Cited

U.S. PATENT DOCUMENTS

| 8,034,660 | B2 | 10/2011 | Takahashi | |
| 2003/0042587 | A1* | 3/2003 | Lee | 257/678 |
| 2005/0236684 | A1* | 10/2005 | Chen et al. | 257/433 |

(Continued)

FOREIGN PATENT DOCUMENTS

WO    2012040274    3/2012

OTHER PUBLICATIONS

Hwang et al., "New Fast Fixed-Delay Sizing Algortithm for High-Performance CMOS Combinational Logic circuits and its application",Sep. 1992, IEEE Proceedings, vol. 139, No. 5, p. 379.*

(Continued)

*Primary Examiner* — Steven Loke
*Assistant Examiner* — Juanita B Rhodes
(74) *Attorney, Agent, or Firm* — Slater & Matsil, L.L.P.

(57) ABSTRACT

An interposer includes a substrate having a contact pad structure and a stud operably coupled to the contact pad structure. A solder ball is seated on the contact pad structure and formed around the stud. The stud is configured to regulate a collapse of the solder ball when a top package is mounted to the substrate.

20 Claims, 6 Drawing Sheets

(56) References Cited

U.S. PATENT DOCUMENTS

2006/0113681 A1* 6/2006 Jeong et al. .................. 257/780
2006/0220259 A1* 10/2006 Chen et al. .................. 257/778
2007/0200234 A1* 8/2007 Gerber et al. ................ 257/734
2008/0020512 A1* 1/2008 Karnezos et al. ............ 438/110
2009/0085185 A1* 4/2009 Byun et al. .................. 257/686
2010/0000775 A1* 1/2010 Shen et al. .................. 174/260
2011/0073900 A1* 3/2011 Sugizaki ...................... 257/99
2011/0140271 A1* 6/2011 Daubenspeck et al. ....... 257/738
2013/0207239 A1* 8/2013 Yu et al. ...................... 257/620
2013/0277838 A1* 10/2013 Yu et al. ...................... 257/738

OTHER PUBLICATIONS iFixit, "Apple A4 Teardown," http://www.ifixit.com/Teardown/Apple-A4-Teardown/2204/1, © 2012 iFixit, 4 pages.

* cited by examiner

LOW PROFILE INTERPOSER WITH STUD STRUCTURE

BACKGROUND

As the demand for smaller electronic products grows, manufacturers and others in the electronics industry continually seek ways to reduce the size of integrated circuits used in the electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic ball grid array (BGA) packages. In PoP package designs, the top package may be interconnected to the bottom package through peripheral solder balls.

Another packaging technique that has been developed is Fan-in Package-on-Package (FiPoP). A FiPoP device may incorporate multiple logic, analog, and memory devices in the bottom package. The FiPoP device structure permits smaller top packages (e.g., memory packages) to be mounted to the bottom package using center ball grid array patterns on the top package.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a package-on-package (PoP) semiconductor device. The concepts in the disclosure may also apply, however, to other semiconductor structures or circuits.

Figure 1:
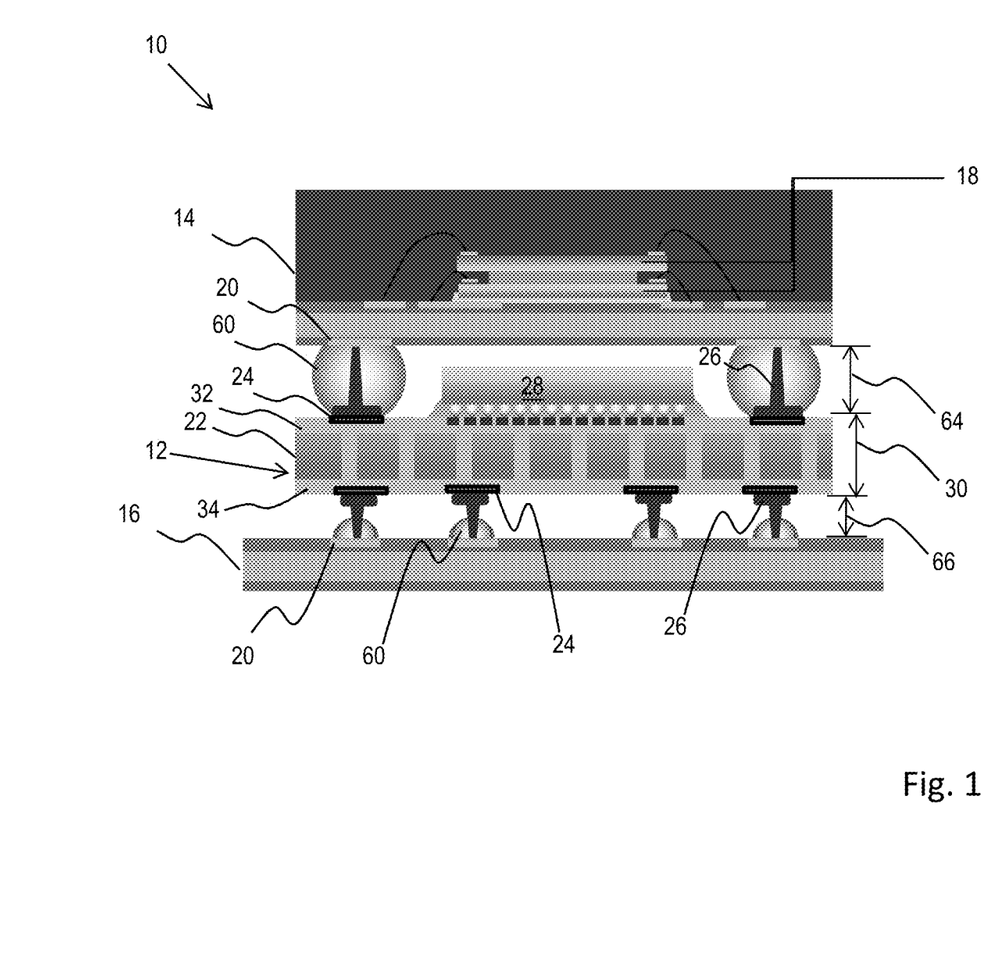
FIG. 1 is a cross section of an embodiment of a package-on-package (PoP) device employing a low profile interposer having studs mounted on contact pad structures.

Referring to FIG. 1, a PoP device 10 employing an embodiment low profile interposer 12 is illustrated. As will be more fully explained below, the interposer 12 provides the PoP device 10 with a reduced vertical profile relative to other known PoP devices when the interposer 12 is used. In addition to offering a lower profile, the interposer 12 may also provide the PoP device 10 with better heat dissipation than, for example, a conventional PoP device.

As shown in FIG. 1, in an embodiment the interposer 12 of the PoP device 10 is disposed between a top package 14 and a printed circuit board 16. In an embodiment, the top package 14 includes a pair of stacked, wire bonded memory chips 18. However, in other embodiments the top package 14 may include more or fewer of the memory chips 18. In addition, the memory chips 18 may be electrically connected to each other (or other circuitry in the PoP device 10) using connections other than wire bonds. The top package 14 may also include other electronic devices in addition to, or instead of, the memory chips 18. In an embodiment, each of the top package 14 and the printed circuit board 16 are electrically coupled to the interposer 12 through contact structures 20 on the top package and the printed circuit board.

The interposer 12 of the PoP device 10 generally includes a substrate 22, one or more contact pad structures 24, and one or more studs 26. In an embodiment the substrate 22 of the interposer 12 supports a chip 28 (e.g., a logic integrated circuit, analog circuit, etc.). The logic chip 28 may be mounted to the substrate 22 using, for example, a flip-chip bonding process such as chip-on-wafer (CoW). In such an embodiment, the interposer 12 may be referred to as a bottom package in the PoP device 10.

The substrate 22 may be formed from silicon, glass, a combination thereof, or some other suitable substrate material or combination of materials. In an embodiment, a silicon substrate 22 is employed because the silicon substrate has a thermal conductivity of approximately one hundred ten Watt per meter per Kelvin (110 W/(m-k)), which is far higher than the twenty-three Watt per meter per Kelvin (23 W/m-K)) offered by an organic substrate.

While not shown, the substrate 22 may include a variety of metallization layers and/or structures to electrically couple the contact pad structures 24 disposed at the top of the interposer 12 to the contact pad structures 24 disposed at the bottom of the interposer 12. In an embodiment, the substrate 22 has a height 30 of approximately fifty microns (50 μm) to approximately one hundred microns (100 μm), which is less than the approximately four hundred micron (400 μm) height of the substrate of other known substrates.

Still referring to FIG. 1, the contact pad structures 24 of the interposer 12 are generally supported by the substrate 22. In an embodiment, the contact pad structures 24 are mounted on or embedded in a top portion 32 of the substrate 22. In another embodiment, the contact pad structures 24 are mounted on or embedded in a bottom portion 34 of the substrate 22. In yet another embodiment, the contact pad structures 24 are formed in both the top and bottom portions 32, 34 of the substrate 22. In other words, the contact pad structures 24 may be situated on opposing sides of the interposer 12.

Figure 2A:
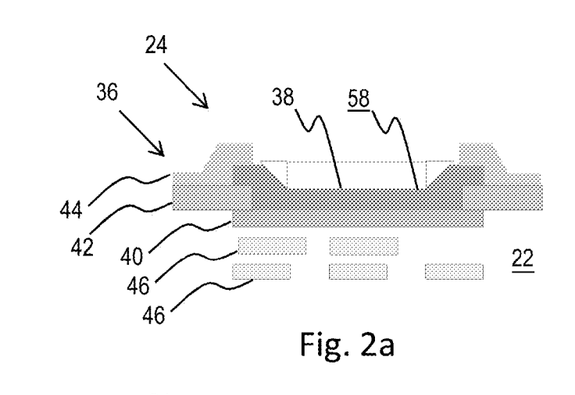
FIGS. 2*a*-2*d* are each a cross section of an embodiment contact pad structure for use with the interposer of FIG. 1.

Referring now to FIGS. 2*a*-2*d*, embodiments of the contact pad structures 24 constructed in or on the substrate 22 of the interposer 12 are shown in further detail. In FIG. 2*a*, a single solid (SS) pad structure 36 is illustrated. The SS pad structure 36 includes a metal pad 38 seated upon or supported by an upper layer of top metal 40. The metal pad 38 may be formed from, for example, aluminum, copper, or another suitable metal. As shown, the upper layer of top metal 40 is generally continuous or uninterrupted beneath the metal pad 38. In an embodiment, the metal pad 38 and the upper layer of top metal 40 each have the same or a similar horizontal length.

As shown, a first passivation layer 42 may be disposed between peripheral portions of the metal pad 38 and the upper layer of top metal 40. In addition, a second passivation layer 44 may be disposed upon the first passivation layer 42. One or both of the first and second passivation layers 42, 44 may be formed from a passivating oxide, silicon nitride (SiN), silicon nitrogen oxide (SiNOx), silicon oxide (SiOx), or other suitable passivation material.

Still referring to FIG. 2a, one or more lower layers of top metal 46 may be disposed vertically beneath the upper layer of top metal 40. Unlike the upper layer of top metal 40 disposed directly beneath and engaged with the metal pad 38, the lower layers of top metal 46 in FIG. 2a are discontinuous. Indeed, the lower layers of top metal 46 are generally spaced apart from each other and the top metal by portions of the substrate 22.

Figure 2B:
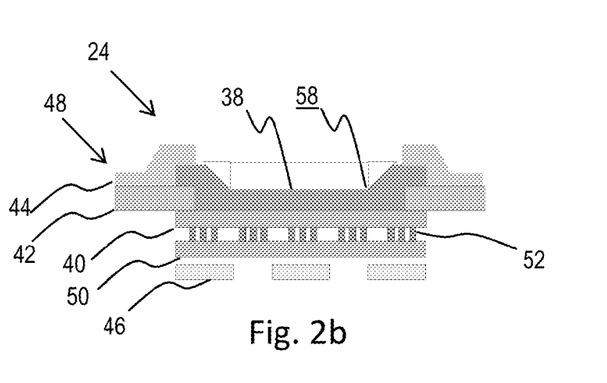

In FIG. 2b, a double solid (DS) pad structure 48 is illustrated. Like the SS pad structure 36 of FIG. 2a, the DS pad structure 48 includes the metal pad 38 and the first and second passivation layers 42, 44. However, the DS pad structure 48 also includes a second upper layer of top metal 50, which is also continuous or uninterrupted, beneath the first layer of top metal 40. As shown, the second upper layer of top metal 50 is spaced apart from the upper layer of top metal 40 by vertically oriented metal interconnections 52.

Figure 2C:
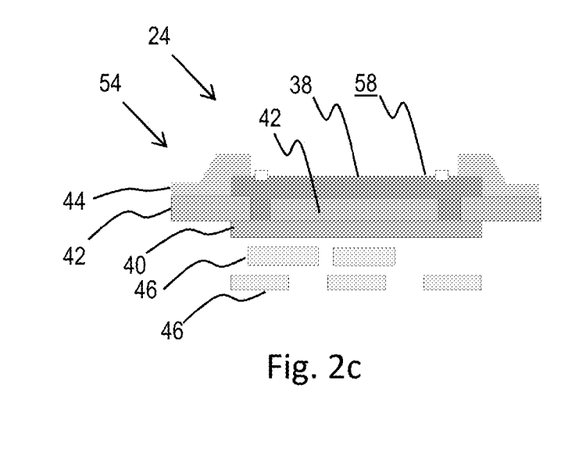
Figure 2D:
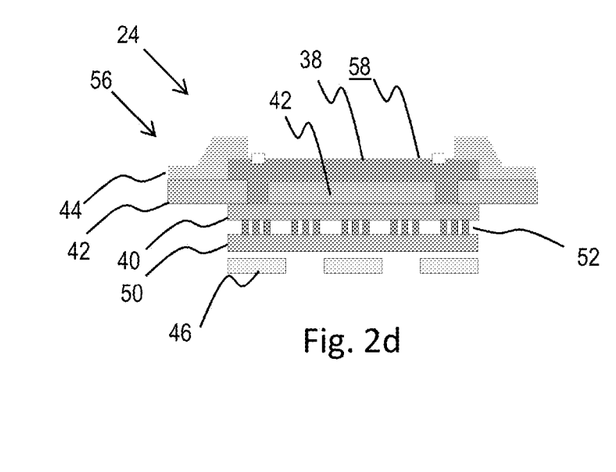

In FIG. 2c, a raised aluminum pad (RAP) SS pad structure 54 is illustrated. The RAP SS pad structure 54 is similar to the SS pad structure 36 of FIG. 2a. However, the first passivation layer 42 in the SS RAP pad structure 54 is disposed between a central portion of the metal pad 38 and the upper layer of top metal 40. In FIG. 2d, a RAP DS pad structure 56 is illustrated. The RAP DS pad structure 56 is similar to the RAP SS pad structure 54 of FIG. 2c. However, RAP DS pad structure 56 also includes the second top metal layer 50 similar to the DS pad structure 48 of FIG. 2b.

In an embodiment, the metal pad 38 may be provided with a surface finish 58. For example, the metal pad 38 may be coated electroless nickel electroless palladium (ENEP), electroless nickel immersion gold (ENIG), electroless nickel electroless palladium immersion gold (ENEPIG), immersion tin (IT), immersion silver (IS), and the like. In an embodiment, the metal pad 38 is free of any surface finish 58. Also, in an embodiment the pad structures 24 constructed in or on the substrate 22 of the interposer 12 may be formed using an under bump metallization (UBM) process. In addition, the pad structures 24 of the interposer 12 may function as a stress barrier layer during placement of the studs 26 on the interposer 12.

Figure 3:
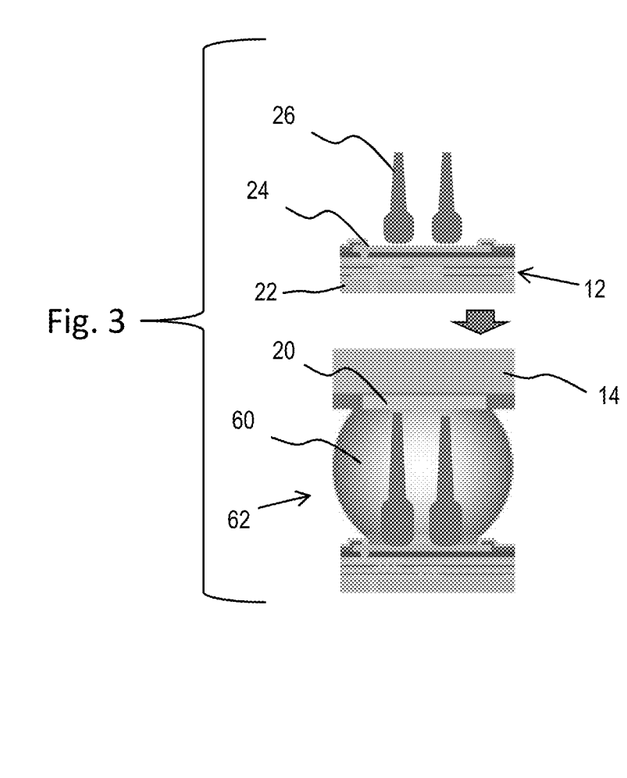
FIG. 3 is a partial cross section of the interposer of FIG. 1 in an embodiment where a plurality of the studs are disposed within a single solder ball seated on one of the contact pad structures.

Referring now to FIG. 3, the studs 26 of the interposer 12 are illustrated in further detail. In an embodiment, the studs 26 are formed from copper or other suitable metal. As shown in FIG. 3, a pair of the studs 26 is seated upon, and electrically coupled to, the contact pad structure 24, which is formed using an aluminum pad or UBM. With the studs 26 secured in place upon the contact pad structure 24, a solder ball 60 from a ball grid array 62 is formed around the studs 26. In an embodiment, the solder ball 60 completely encapsulates exposed portions or surfaces of the studs 26. In another embodiment, the solder ball 60 surrounds or encircles only a portion of the studs 26.

As shown in FIG. 3, the studs 26 and the solder ball 60 are used to electrically couple the interposer 12 to the top package 14. As shown in FIG. 1, when the studs 26 and the solder ball 60 are used a PoP standoff 64 is approximately two hundred microns (200 µm), which is less than the two hundred fifty micron (250 µm) height of the PoP standoff found in other application chips. In addition, use of the studs 26 also lowers the voltage drop through the PoP device 10. This is due to the shorter path through the interposer 12 and the studs 26 coupled to the circuit board 16 (FIG. 1) relative to, for example, the path through a conventional substrate and a ball grid array.

Still referring to FIG. 1, in an embodiment the interposer 12 may include studs 26 on opposing sides. As such, the studs 26 may also be used to electrically couple the interposer to the circuit board 16. When the studs 26 are coupled with solder balls 60 on the circuit board 16, a pin grid array (PGA) standoff 66 is approximately one hundred microns (100 µm), which is less than the two hundred micron (200 µm) height of the PGA standoff found in other application chips.

Therefore, when the studs 26 and the low profile interposer 12 are employed in the PoP device 10, the overall vertical profile of the PoP device 10 is reduced by approximately four hundred fifty microns (450 µm) relative to the overall vertical profile of other application chips (i.e., a 200 µm PoP standoff in the PoP device 10 vs. a 250 µm Pop standoff for other application chips, a 100 µm interposer height in the PoP device 10 vs. a 400 µm interposer height for other application chips, and 100 µm PGA standoff in the PoP device 10 vs. a 200 µm Pop standoff for other application chips). In other words, the interposer 12 of the PoP device 10 has an overall z-profile of approximately four hundred microns (450 µm) while the equivalent structure in other application chips has a z-profile of approximately eight hundred and fifty microns (850 µm).

In addition to the above, the studs 26 of the interposer 12 allow a minimum PoP standoff height 64 and/or a minimum PGA standoff height 66 to be better and more accurately controlled. Indeed, the studs 26 may be used to control a collapse of the solder balls 60. In addition, by controlling the collapse of the solder balls 60 a gap formed between a top surface of the chip 28 and the bottom surface of the top package 14, the PoP device 10 may provide improved heat dissipation. The studs 26 also provide better stress distribution for the solder balls 60.

Figure 4:
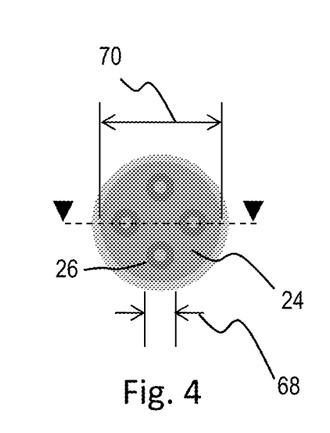
FIG. 4 is a top view of the studs of FIG. 3 disposed on the contact pad structure.

Referring now to FIG. 4, the studs 26 and the contact pad structure 24 of FIG. 3 are illustrated from above prior to the solder ball 60 of FIG. 3 being formed around the studs 26. As shown, the studs 26 have a circumference 68 of approximately fifty microns (50 µm). In addition, the contact pad 24 has a circumference 70 of approximately two hundred forty microns or less (240 µm) when the contact pad structures 24 are formed using an aluminum pad or an aluminum pad and UBM.

Figure 5:
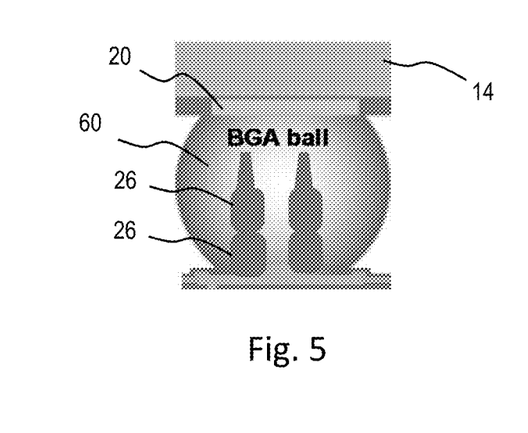
FIG. 5 is a partial cross section of the interposer of FIG. 1 in an embodiment where the studs are formed from stacked studs.

As shown in FIG. 5, several of the studs 26 may be vertically stacked together. In FIG. 5, two of the studs 26 have been stacked. In an embodiment, three of the studs 26 are stacked one top of the other. The studs 26 shown in FIGS. 1-5 may have a vertical height less than or equal the vertical height of the solder ball 60 (FIG. 3) in the ball grid array 62 or solder connection. In an embodiment, the studs 26 may also have a vertical height that exceeds the height of the solder ball 60 or solder connection.

Figures 6A, 6B:
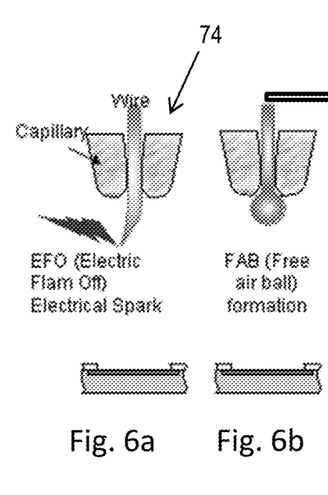
FIGS. 6*a*-6*h* collectively illustrate an embodiment of a process of wire bonding used to form the studs of FIG. 1.
Figure 6C:
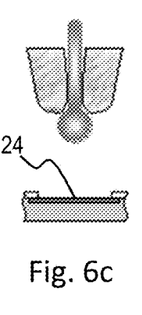
Figure 6D:
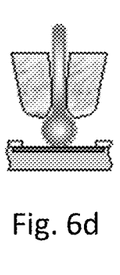
Figure 6E:
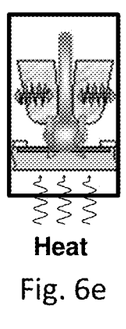
Figure 6F:
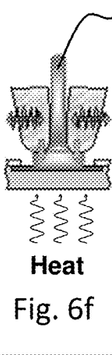
Figures 6G, 6H:
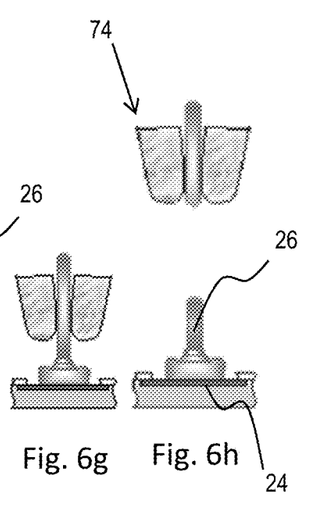

Referring collectively to FIGS. 6a-6h, an embodiment of a process 72 for forming the studs 26 on the interposer 12 is sequentially illustrated. In FIG. 6a, a wire bonder 74 uses a capillary to feed a portion of wire. An electric flame off (EFO)

wand provides an EFO electrical spark, which generates a free air ball (FAB) formation at the end of the capillary as shown in FIG. 6b. Thereafter, the wire bonder 74 is lowered toward the contact pad structure 24 as shown in FIG. 6c until the FAB makes contact as shown in FIG. 6d. Next, a downward force, ultrasonic vibration, and heat are applied as shown in FIG. 6e, which begins to collapse the FAB. Once the FAB has sufficiently collapsed as shown in FIG. 6f, a base portion of the stud 26 is formed on the contact pad structure 24. With the base portion of the stud 26 secured to the contact pad structure 24, the wire bonder 74 is lifted upwardly away from the contact pad structure 24 as shown in FIG. 6g and the wire is cut as shown in FIG. 6h, which leaves the stud 26 mounted to the contact pad structure 24. At this stage of the process 72, the stud forming process is generally completed.

Figure 7A:
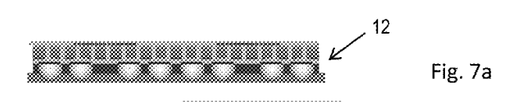
FIGS. 7*a*-7*g* collectively illustrate an embodiment of a method used to form the PoP device of FIG. 1 without any bottom studs.
Figure 7B:
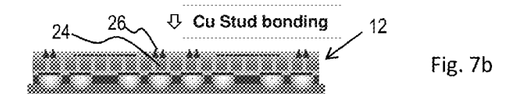
Figure 7C:
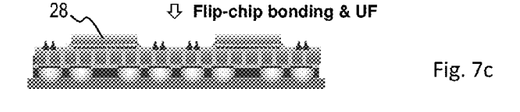
Figure 7D:
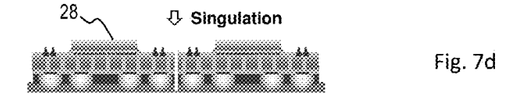
Figure 7E:
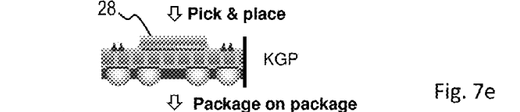
Figure 7F:
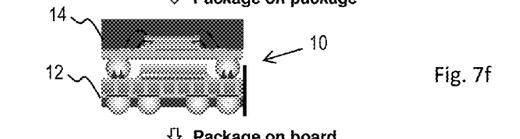
Figure 7G:
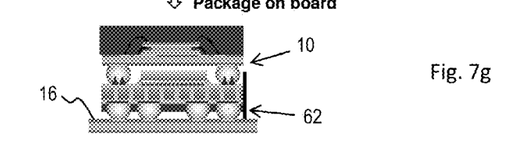

Referring collectively to FIGS. 7a-7g, an embodiment of a method 76 of forming the PoP device 10 (without studs 26 between the interposer 12 and the circuit board 16) is schematically and sequentially illustrated. Referring now to FIGS. 7a-7b, one or more of the studs 26 are bonded to the contact pad structures 24 using, for example, the process illustrated in FIG. 6. With the studs 26 in place, a flip-chip and underfilling (UF) process is employed to mount the chip 28 to the interposer 12 to produce, for example, several bottom packages in FIG. 7c. Thereafter, in FIG. 7d, singulation occurs to separate the bottom packages from each other. Once separated, known good packages (KGP) are subjected to a pick and place procedure as shown in FIG. 7e and a package on package process shown in FIG. 7f seats the top package 14 on the interposer 12 (e.g., bottom package) to form the PoP device 10. Finally, the PoP device 10 may be secured to the circuit board 16 using the ball grid array 62 as shown in FIG. 7g.

Referring collectively to FIGS. 8a-8j, another embodiment of a method 80 of forming the PoP device 10 is schematically and sequentially illustrated. Many of the processes/procedures in the method 80 are similar or the same as the processes/procedures found in the method 76 of FIGS. 7a-7g. Therefore, a detailed description of those processes/procedures has not been repeated herein. However, unlike the method 76 shown in FIGS. 7a-7g, the studs 26 in the method 80 are utilized between the interposer 12 and the circuit board 16.

Figure 8A:
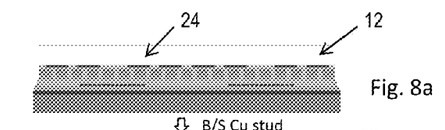
FIGS. 8*a*-8*j* collectively illustrate an embodiment of a method used to form the PoP device of FIG. 1 with the bottom studs.
Figure 8B:
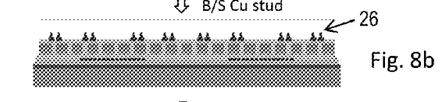
Figure 8C:
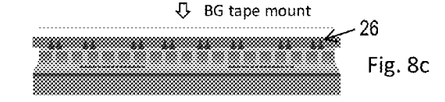
Figure 8D:
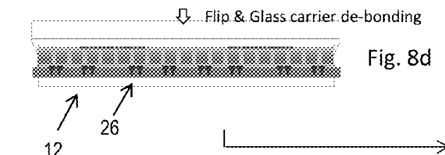
Figure 8E:
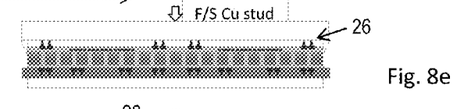

Referring now to FIGS. 8a-8b, one or more of the studs 26 are bonded to the contact pad structures 24 using, for example, the process illustrated in FIG. 6. As shown in FIG. 8c, a tape mount process is performed. In FIG. 8d, the assembly is flipped and the glass carrier is removed from the interposer 12. Next, as shown in FIG. 8e, one or more of the studs 26 are bonded to the contact pad structures 24 on the front side of the interposer 12 using, for example, the process illustrated in FIG. 6.

Figure 8F:
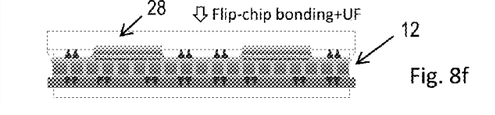
Figure 8G:
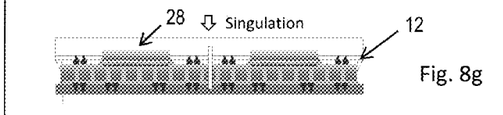
Figure 8H:
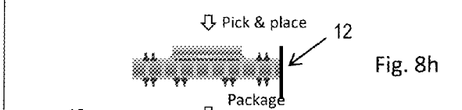
Figure 8I:
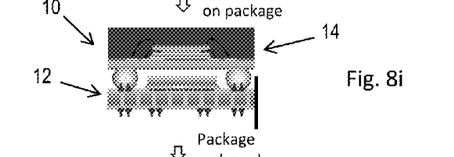
Figure 8J:
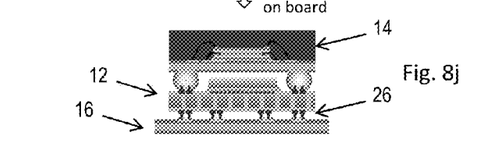

With the studs 26 in place on the front side, a flip-chip and underfilling (UF) process is employed to mount the chip 28 to the interposer 12 to produce, for example, several bottom packages in FIG. 8f. Thereafter, in FIG. 8g, singulation occurs to separate the bottom packages from each other. Once separated, known good packages (KGP) are subjected to a pick and place procedure as shown in FIG. 8h and a package on package process shown in FIG. 8i seats the top package 14 on the interposer 12 (e.g., bottom package) to form the PoP device 10. Finally, the PoP device 10 may be secured to the circuit board 16 using the studs 26 as shown in FIG. 8j.

An interposer comprising a substrate having a contact pad structure a stud operably coupled to the contact pad structure, and a solder ball seated on the contact pad structure and formed around the stud, the stud configured to regulate a collapse of the solder ball when a top package is mounted to the substrate.

A package-on-package (PoP) device comprising an interposer including a substrate having a first side opposing a second side, a first stud disposed within a solder ball seated on a first contact pad structure on the first side, and a second stud mounted on a second contact pad structure on the second side, the second contact pad structure configured to engage a circuit board, and a top package mounted to the interposer using the first stud and the solder ball, the first stud regulating a collapse of the solder ball.

A method of forming an interposer comprising forming a contact pad structure on a first side of a substrate, mounting a stud on the contact pad structure, and forming a solder ball around at least a portion of the stud.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An interposer, comprising:
    a substrate having a periphery area and a die attach area, the periphery area having a first contact pad structure and the die attach area having a second contact pad structure;
    a first stud and a second stud operably coupled to the first contact pad structure, the second contact pad structure being free of any studs; and
    a solder ball seated on the first contact pad structure and formed around vertical sidewalls of the first stud;
    wherein the first stud is configured to regulate a vertical collapse of the solder ball when a top package is mounted to the substrate.

2. The interposer of claim 1, wherein the first contact pad structure comprises a single solid pad.

3. The interposer of claim 1, wherein the first stud is formed from at least two stacked studs.

4. The interposer of claim 1, wherein the substrate has a third contact pad structure on an opposing side of the substrate relative to the first contact pad structure, the third contact pad structure having a third stud operably coupled thereto.

5. The interposer of claim 1, wherein a logic chip is mounted to the second contact pad structure of the substrate to form a bottom package.

6. A package-on-package (PoP) device, comprising:
    an interposer including a substrate having a first side opposing a second side, a first stud disposed within a solder ball seated on a first contact pad structure on the first side, and a second stud mounted on a second contact pad structure on the second side;
    a die mounted on the first side of the interposer, wherein the first stud extends farther from the interposer than an uppermost surface of the die, electrical connections directly between the die and the interposer being free of studs extending from a contact pad; and
    a top package mounted to the interposer using the first stud and the solder ball, the first stud regulating a vertical collapse of the solder ball.

7. The PoP device of claim 6, wherein the die is a logic chip to form a bottom package.

8. The PoP device of claim 6, wherein at least one of the first stud and the second stud is formed from at least two stacked studs.

9. A method of forming an interposer, comprising:
   forming a first contact pad structure and a second contact pad structure on a first side of a substrate;
   mounting a first stud on the first contact pad structure, leaving the second contact pad structure free of any studs;
   forming a solder ball around at least a portion of vertical sidewalls of the first stud; and
   forming a second stud on a second side of the substrate, the second side of the substrate opposing the first side of the substrate;
   wherein the first stud is configured to regulate a vertical collapse of the solder ball when a top package is mounted to the substrate.

10. The interposer of claim 1, wherein the first contact pad structure comprises:
    a contact pad, wherein the first stud is coupled to the contact pad;
    a first metal pad in a topmost metallization layer directly contacting the contact pad without any intervening vias;
    a second metal pad in a next topmost metallization layer, the second metal pad being vertically aligned below the first metal pad, the first metal pad being interposed between the contact pad and the second metal pad;
    a dielectric layer interposed between the first metal pad and the second metal pad; and
    a plurality of vias extending through the dielectric layer, the plurality of vias interposed directly between the first metal pad and the second metal pad.

11. The interposer of claim 1, wherein the first contact pad structure comprises:
    a first metal pad in a topmost metallization layer;
    a passivation layer overlying the first metal pad, the passivation layer having openings exposing the first metal pad; and
    a contact pad overlying the passivation layer, the contact pad extending through the openings in the passivation layer to the first metal pad, wherein the first stud is coupled to the contact pad.

12. The interposer of claim 11, further comprising:
    a second metal pad in a next topmost metallization layer, the second metal pad being vertically aligned below the first metal pad, the first metal pad being interposed between the contact pad and the second metal pad, the first metal pad being electrically coupled to the second metal pad by a plurality of vias.

13. The PoP device of claim 6, wherein at least one of the first contact pad structure and the second contact pad structure comprises:
    a contact pad;
    a first metal pad in a topmost metallization layer directly contacting the contact pad without any intervening vias;
    a second metal pad in a next topmost metallization layer; and
    a dielectric layer interposed between the first metal pad and the second metal pad, the second metal pad being vertically aligned below the first metal pad, the first metal pad being interposed between the contact pad and the second metal pad, the first metal pad being electrically coupled to the second metal pad by a plurality of vias, the plurality of vias extending through the dielectric layer.

14. The PoP device of claim 6, wherein at least one of the first contact pad structure and the second contact pad structure comprises:
    a first metal pad in a topmost metallization layer;
    a passivation layer overlying the first metal pad, the passivation layer having openings exposing the first metal pad; and
    a contact pad overlying the passivation layer, the contact pad extending through the openings in the passivation layer to the first metal pad, wherein a stud is coupled to the contact pad.

15. The PoP device of claim 14, further comprising:
    a second metal pad in a next topmost metallization layer, the second metal pad being vertically aligned below the first metal pad, the first metal pad being interposed between the contact pad and the second metal pad, a dielectric layer being interposed between the first metal pad and the second metal pad, the first metal pad being electrically coupled to the second metal pad by a plurality of vias, the plurality of vias extending through the dielectric layer.

16. The method of claim 9, wherein the first contact pad structure comprises:
    a contact pad, wherein the first stud is coupled to the contact pad;
    a first metal pad in a topmost metallization layer directly contacting the contact pad without any intervening vias; and
    a second metal pad in a next topmost metallization layer, the second metal pad being vertically aligned below the first metal pad, the first metal pad being interposed between the contact pad and the second metal pad, the first metal pad being electrically coupled to the second metal pad by a plurality of vias.

17. The method of claim 9, wherein the first contact pad structure comprises:
    a first metal pad in a topmost metallization layer;
    a passivation layer overlying the first metal pad, the passivation layer having openings exposing the first metal pad; and
    a contact pad overlying the passivation layer, the contact pad extending through the openings in the passivation layer to the first metal pad, wherein the first stud is coupled to the contact pad.

18. The method of claim 17, further comprising:
    a second metal pad in a next topmost metallization layer, the second metal pad being vertically aligned below the first metal pad, the first metal pad being interposed between the contact pad and the second metal pad, the first metal pad being electrically coupled to the second metal pad by a plurality of vias.

19. The method of claim 9, wherein the mounting the first stud comprises:
    mounting a first stud portion on the first contact pad structure; and
    mounting a second stud portion on the first stud portion.

20. The method of claim 9, further comprising:
    mounting a die to the second contact pad structure on the first side of the substrate; and
    mounting the top package to the first contact pad structure on the first side of the substrate.

* * * * *